United States Patent
Lee et al.

(10) Patent No.: US 7,179,704 B2
(45) Date of Patent: Feb. 20, 2007

(54) METHODS OF FORMING CAPACITORS WITH HIGH DIELECTRIC LAYERS AND CAPACITORS SO FORMED

(75) Inventors: Seung-hwan Lee, Seoul (KR); Jae-dong Byun, Seoul (KR); Sung-tae Kim, Seoul (KR); Young-sun Kim, Gyeonggi-do (KR); Dal-won Lee, Seoul (KR); Song-won Ko, Seoul (KR)

(73) Assignee: Samsung Electronics Co., Ltd. (KR)

( * ) Notice: Subject to any disclaimer, the term of this patent is extended or adjusted under 35 U.S.C. 154(b) by 39 days.

(21) Appl. No.: 11/002,571

(22) Filed: Dec. 2, 2004

(65) Prior Publication Data

US 2005/0186687 A1    Aug. 25, 2005

(30) Foreign Application Priority Data

Dec. 5, 2003    (KR)    .................... 10-2003-0087976

(51) Int. Cl.
*H01L 21/8242* (2006.01)
(52) U.S. Cl. .................... 438/239; 438/240; 438/250; 257/E21.011
(58) Field of Classification Search .............. None
See application file for complete search history.

(56) References Cited

U.S. PATENT DOCUMENTS 6,143,597 A * 11/2000 Matsuda et al. ............. 438/240
6,323,057 B1 * 11/2001 Sone ........................ 438/104
2001/0014482 A1 * 8/2001 Agarwal et al. ............. 438/2

FOREIGN PATENT DOCUMENTS

| JP | 2000114484 | 4/2000 |
|---|---|---|
| KR | 000008014 | 2/2000 |
| KR | 000042388 | 7/2000 |
| KR | 10-2002-0012878 | 2/2002 |
| KR | 10-2003-0039893 | 5/2003 |

OTHER PUBLICATIONS

Notice to Submit a Response for Korean patent application No. 10-2003-0087976 mailed on Sep. 30, 2005.

* cited by examiner

*Primary Examiner*—Michael Lebentritt
*Assistant Examiner*—Cheung Lee
(74) *Attorney, Agent, or Firm*—Myers Bigel Sibley & Sajovec, PA

(57) ABSTRACT

Methods of forming a capacitor of a semiconductor device can include forming a lower electrode of a capacitor on a semiconductor substrate and forming a dielectric material layer of $Ba(Ti_{1-x}Sn_x)O_3$ (BTS) or $Ba(Ti_{1-x}Zr_x)O_3$ (BTZ) on the lower electrode. An amorphous layer can be formed on the dielectric material layer. An upper electrode of the capacitor can be formed on the amorphous layer.

17 Claims, 3 Drawing Sheets

METHODS OF FORMING CAPACITORS WITH HIGH DIELECTRIC LAYERS AND CAPACITORS SO FORMED

CROSS-REFERENCE TO RELATED APPLICATION

This application claims the priority of Korean Patent Application No. 2003-87976, filed on Dec. 5, 2003, in the Korean Intellectual Property Office, the disclosure of which is incorporated herein in its entirety by reference.

FIELD OF THE INVENTION

The present invention relates to methods of forming capacitors and devices so formed.

BACKGROUND

As the integration level of semiconductor devices, such as DRAMs, is increased, a capacitor based cell area therein may be decreased. Moreover, it may be difficult to provide the needed capacitance for the capacitor even if a dielectric layer formed of oxide layer/nitride layer ($SiO_2/Si_3N_4$) is thinned. Accordingly, various research has been conducted for enlarging a surface area of a capacitor to secure a required capacitance. For example, an increased height capacitor can be formed in a semiconductor substrate, however, this approach may result in a surface of an electrode of the capacitor being unevenly formed. In a highly integrated DRAM device of 1 giga bit (Gb) and higher, the dielectric layer of oxide layer/nitride layer that has a low dielectric constant may be difficult to further thin to increase the capacitance. Moreover, if the capacitor is formed by a complicated process of enlarging the surface area of the capacitor, the fabricating process may become considerably more complex, thereby possibly degrading yield and increasing fabricating cost.

One approach used in view of the problems discussed above involves the use of a high dielectric material layer with a high dielectric constant. The high dielectric material layer can include $Ba_{1-x}Sr_xTiO_3$ (BST) layer, etc. The BST layer may be attractive because of relatively high dielectric constant, but may present significant problems associated with reproducibility of compositions of chemical elements such as Ba, Sr and Ti.

SUMMARY

Embodiments according to the invention can provide methods of forming capacitors with high dielectric layers and capacitors so formed. Pursuant to these embodiments, a method of forming a capacitor of a semiconductor device can include forming a lower electrode of a capacitor on a semiconductor substrate and forming a dielectric material layer of $Ba(Ti_{1-x}Sn_x)O_3$ (BTS) or $Ba(Ti_{1-x}Zr_x)O_3$ (BTZ) on the lower electrode. An amorphous layer can be formed on the dielectric material layer. An upper electrode of the capacitor can be formed on the amorphous layer.

In some embodiments according to the invention, the amorphous layer can include $PbO$—$B_2O_3$, $Bi_2O_3$—$B_2O_3$, or $GeO_2$—$B_2O_3$. In some embodiments according to the invention, forming a dielectric material layer can include depositing the dielectric material layer on the lower electrode and crystallizing the dielectric material layer. In some embodiments according to the invention, crystallizing the dielectric material layer can include annealing the semiconductor substrate with the dielectric material layer thereon at a temperature of about 300 degrees centigrade to about 900 degrees centigrade in an oxidation ambient.

In some embodiments according to the invention, forming the upper electrode is followed by annealing the capacitor at a temperature higher than a melting point of the amorphous layer. In some embodiments according to the invention, forming the upper electrode is followed by annealing the capacitor at a temperature of abut 300 degrees centigrade to about 900 degrees centigrade. In some embodiments according to the invention, forming an amorphous layer can include forming the amorphous layer using organic metal oxide chemical vapor deposition, metal organic deposition, sputtering and/or spin coating.

In some embodiments according to the invention, a capacitor of a semiconductor device can include a lower electrode formed on a semiconductor substrate and a dielectric material layer of $Ba(Ti_{1-x}Sn_x)O_3$ (BTS) or $Ba(Ti_{1-x}Zr_x)O_3$ (BTZ) on the lower electrode. An amorphous layer is on the dielectric material layer and the upper electrode is on the amorphous layer. In some embodiments according to the invention, the amorphous layer includes $PbO$—$B_2O_3$, $Bi_2O_3$—$B_2O_3$, or $GeO_2$—$B_2O_3$.

In some embodiments according to the invention, a method of forming a capacitor of a semiconductor device can include forming a dielectric material layer of $Ba(Ti_{1-x}Sn_x)O_3$ (BTS) or $Ba(Ti_{1-x}Zr_x)O_3$ (BTZ) and forming an amorphous layer directly on the dielectric material layer. In some embodiments according to the invention, the method further includes forming an upper electrode of the capacitor on the amorphous layer and annealing at a temperature greater than a melting point of the amorphous layer.

In some embodiments according to the invention, annealing includes annealing at a temperature of about 300 degrees centigrade to about 900 degrees centigrade. In some embodiments according to the invention, annealing includes annealing at a temperature of about 700 degrees centigrade. In some embodiments according to the invention, forming the upper electrode and the annealing are performed substantially simultaneously.

In some embodiments according to the invention, forming an amorphous layer includes forming the amorphous layer of $PbO$—$B_2O_3$, $Bi_2O_3$—$B_2O_3$ or $GeO_2$—$B_2O_3$. In some embodiments according to the invention, the $B_2O_3$ is about 2 mol % to about 20 mol %.

In some embodiments according to the invention, the annealing at a temperature greater than a melting point of the amorphous layer forms a fused layer from the amorphous layer and the dielectric material layer. In some embodiments according to the invention, forming an amorphous layer includes forming the amorphous layer using sputtering using an amorphous target, thermal vaporing an amorphous powder, dipping an amorphous alkoxide solution, and/or spin coating an amorphous alkoxide solution.

In some embodiments according to the invention, a method of forming a capacitor includes fusing a dielectric material layer of $Ba(Ti_{1-x}Sn_x)O_3$ (BTS) or $Ba(Ti_{1-x}Zr_x)O_3$ (BTZ) with an amorphous layer directly underlying the dielectric material layer. In some embodiments according to the invention, fusing includes annealing at a temperature of about 300 degrees centigrade to about 900 degrees centigrade.

DETAILED DESCRIPTION OF EMBODIMENTS ACCORDING TO THE INVENTION

Figure 1:
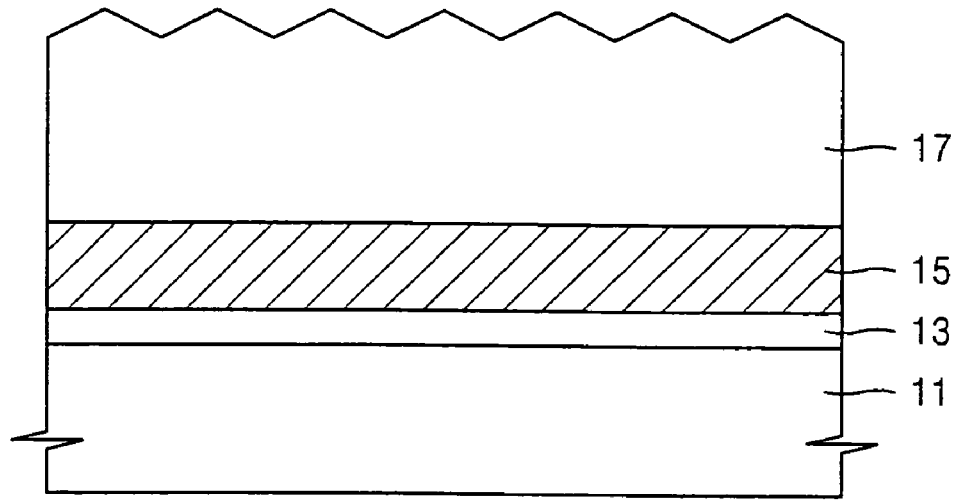
FIGS. 1, 2 and 3 are cross-sectional views illustrating methods of forming capacitors in semiconductor devices according to some embodiments of the invention and capacitors so formed.

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 2:
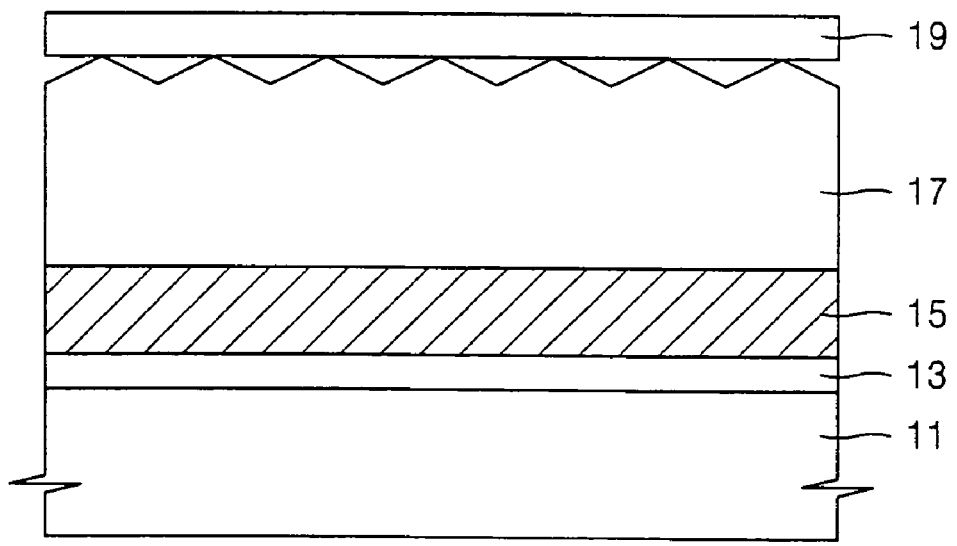
Figure 3:
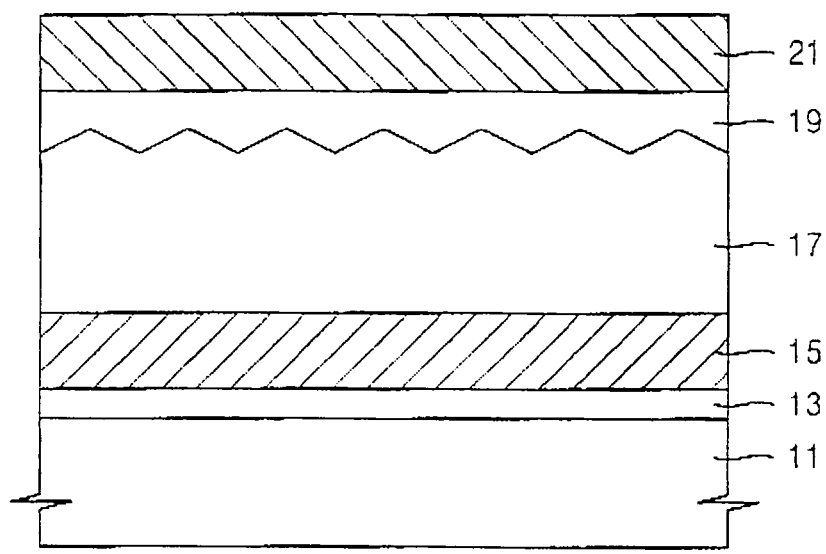
Figure 4:
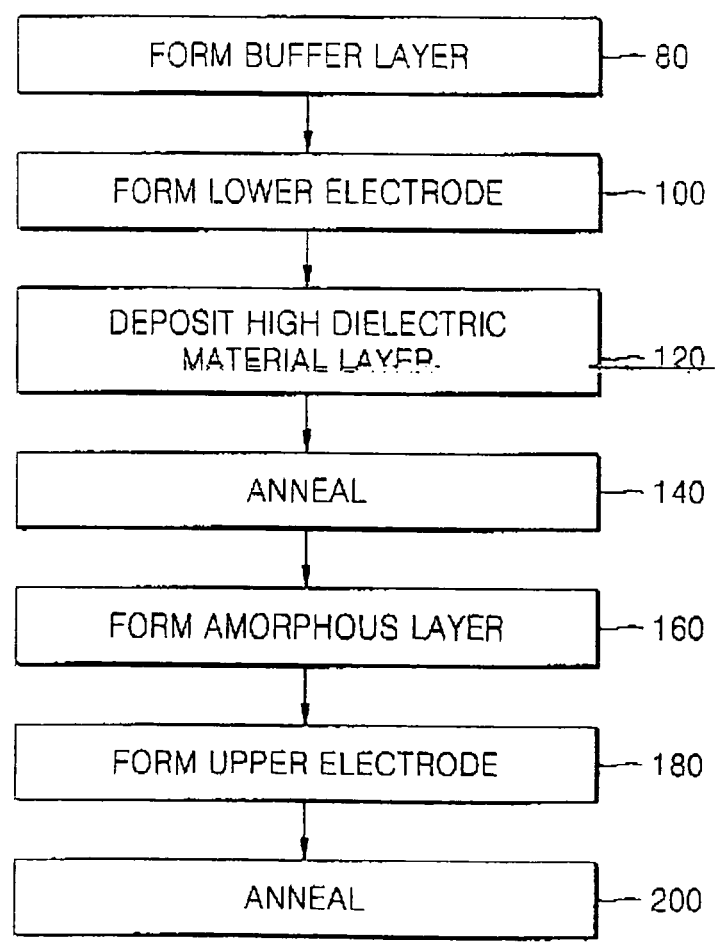
FIG. 4 is a flowchart illustrating methods of forming capacitors in semiconductor devices according to some embodiments of the invention.

FIGS. 1, 2 and 3 are cross-sectional views illustrating formation of capacitors in semiconductor devices according to some embodiments of the invention. FIG. 4 is a flowchart illustrating methods of fabricating capacitors in semiconductor devices according to some embodiments of the invention.

Referring to FIG. 1, a buffer layer 13 is formed on a semiconductor substrate 11, such as a silicon substrate (step 80). In some embodiments according to the invention, if the semiconductor substrate 11 is formed of silicon, the buffer layer 13 can include an oxide layer ($SiO_2$) and a titanium layer (Ti). The buffer layer 13 may promote the formation of a lower electrode under favorable conditions during a subsequent process. A lower electrode 15 of the capacitor is formed on the buffer layer 13 (step 100). In some embodiments according to the invention, the lower electrode 15 is formed of platinum Pt.

A high dielectric material layer 17 formed of $Ba(Ti_{1-x}Sn_x)O_3$ (BTS) and/or $Ba(Ti_{1-x}Zr_x)O_3$ (BTZ) is deposited on the lower electrode 15 using Metal Organic Chemical Vapor Deposition (MOCVD), Metal Organic Deposition (MOD), sputtering, and/or spin coating (step 120). The semiconductor substrate 11 having the high dielectric material layer 17 thereon is annealed at a temperature of about 300 degrees centigrade to about 900 degrees centigrade, and preferably at about 700 degrees centigrade in an oxidation ambient for about 10 seconds, to promote crystallization of the high dielectric material layer 17 (step 140).

As appreciated by the present inventors, if the high dielectric material layer 17 is formed using sputtering, MOCVD or spin coating (i.e., according to the prior art), a microscopic surface of the high dielectric material layer 17 may become uneven as shown in FIG. 1. The high dielectric material layer 17 with the unevenly formed microscopic surface forms an uneven interface with an upper electrode formed in a subsequent process. As appreciated by the present inventors, the dielectric property and leakage current characteristics of the capacitor may deteriorate unless this type of damage is treated.

Referring to FIG. 2, an amorphous layer 19 is formed on the crystallized high dielectric material layer 17 (step 160). The amorphous layer 19 may promote improvement in the uneven microscopic surface of the high dielectric material layer 17. In other words, the amorphous layer 19 can address the uneven interface that may be formed between the high dielectric material layer 17 and the subsequently formed upper electrode. In some embodiments according to the invention, the adhesion between the high dielectric material layer 17 and the subsequently formed upper electrode may be increased. In some embodiments according to the invention, treating the uneven interface between the high dielectric material layer 17 and the subsequently formed upper electrode, may improve the dielectric property and the leakage current characteristics.

In some embodiments according to the invention, the amorphous layer 19 is formed of a material having a relatively low melting point, suitable electrical characteristics and fusing properties relative to the subsequently formed upper electrode. In some embodiments according to the invention, the amorphous layer 19 is formed of PbO—$B_2O_3$, $Bi_2O_3$—$B_2O_3$ or $GeO_2$—$B_2O_3$. In some embodiments according to the invention, the amorphous layer 19 is formed of a material that contains a relatively small quantity of $B_2O_3$, PbO, $Bi_2O_3$ or $GeO_2$. In some embodiments according to the invention, the quantity of $B_2O_3$ may be about 2 mol % to about 20 mol %. In some embodiments according to the invention, the amorphous layer 19 may be formed using sputtering by means of an amorphous target, thermal vaporing an amorphous powder, and/or dipping or spin coating an amorphous alkoxide solution. In some embodiments according to the invention, a solution containing the amorphous layer is spin coated.

Referring to FIG. 3, an upper electrode 21 formed of, for example, Pt is deposited on the amorphous layer 19 (step 180). The semiconductor substrate 11 formed with the amorphous layer 19 and the upper electrode 21 thereon is annealed at a temperature that is higher than a melting point of the amorphous layer 19, for example, for 10 seconds (step 200). In some embodiments according to the invention, the annealing is performed at about 300 degrees centigrade to about 900 degrees centigrade, and preferably at about 700 degrees centigrade. The annealing may improve the adhesion of the high dielectric material layer 17 and the amorphous layer 19.

As a result, according to the present invention, the semiconductor substrate 11 formed with the amorphous layer 19 and the upper electrode 21 thereon is annealed. Therefore, the amorphous layer 19 and the high dielectric material layer 17 may be fused together, thereby allowing an improvement in the adhesion between the high dielectric material layer 17 and the amorphous layer 19 and the adhesion between the amorphous layer 19 and the upper electrode 21. While the annealing for improvement of the adhesion (step 200) is performed after forming the upper electrode 21 in some embodiments according to the invention, the annealing may be performed during forming the upper electrode 21.

Figure 5:
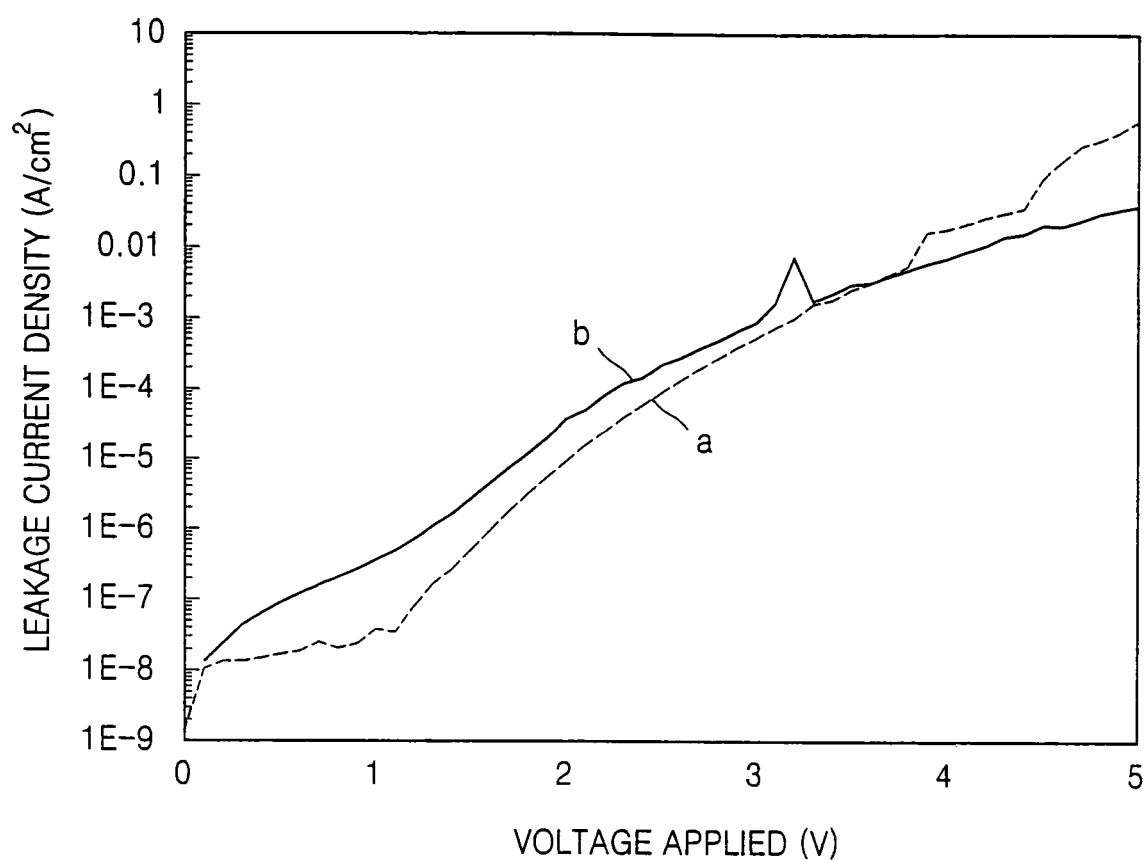
FIG. 5 is a graph plotting leakage current densities as a function of voltage applied to a capacitor formed according to an embodiment of the invention.

FIG. 5 is a graph plotting leakage current densities measured as a function of voltage applied to a capacitor formed according to an embodiment of the invention. More specifically, reference character "a" denotes a leakage current density of a capacitor fabricated by including the amorphous layer according to the invention, and reference character "b" denotes a leakage current density of a conventionally formed capacitor with no amorphous layer for comparison with the embodiment formed according to the invention. Referring to FIG. 5, the leakage current of the capacitor with no amorphous layer is about $10^{-6}$ A/cm$^2$ at an applied voltage of about 1.5V, whereas the capacitor including the amorphous layer according to the invention is about $10^{-7}$ A/cm$^2$ at an applied voltage of about 1.5V.

Furthermore, it was measured that a capacitance of a capacitor with no amorphous layer was about 2.4 nF and a dielectric loss thereof was about 3.44%. On the other hand, a capacitance of the capacitor including the amorphous layer formed according to an embodiment of the invention was about 3.84 nF and a dielectric loss thereof was about 0.78%. As a result, a capacitor of a semiconductor device fabricated according to some embodiments of the present invention is formed with the amorphous layer at the interface of the high dielectric material layer and the upper electrode.

In some embodiments according to the invention, a capacitor of a semiconductor device includes a high dielectric material layer such as BTS or BTZ, to allow improvement in the issue of reproducibility caused when adjusting composition of the BTS layer. Also, an amorphous layer is formed between a high dielectric material layer and an upper electrode, so that adhesion between the high dielectric material layer and the upper electrode may be improved to allow enhancement of the leakage current characteristic and the dielectric property. The enhanced leakage current characteristic and the dielectric property may allow the high dielectric material layer of the capacitor to be formed thinner more reliably.

A capacitor of a semiconductor device according to some embodiments of the present invention can obtain a capacitance value of 25 fF/cell, which may be adequate for DRAM devices of 1 Gb and higher even within a limited two-dimensional area. Moreover, the leakage current characteristic and the dielectric property may be enhanced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed:

1. A method of forming a capacitor of a semiconductor device comprising:

forming a lower electrode of a capacitor on a semiconductor substrate;

forming a dielectric material layer comprising Ba(Ti$_{1-x}$Sn$_x$)O$_3$ (BTS) and/or Ba(Ti$_{1-x}$Zr$_x$)O$_3$ (BTZ) on the lower electrode;

forming an amorphous layer on the dielectric material layer;

forming an upper electrode of the capacitor on the amorphous layer; and annealing the capacitor at a temperature higher than a melting point of the amorphous layer.

2. A method of forming a capacitor of a semiconductor device comprising:

forming a lower electrode of a capacitor on a semiconductor substrate;

forming a dielectric material layer comprising Ba(Ti$_{1-x}$Sn$_x$)O$_3$ (BTS) and/or Ba(Ti$_{1-x}$Zr$_x$)O$_3$ (BTZ) on the lower electrode;

forming an amornhous layer on the dielectric material layer;

forming an upper electrode of the capacitor on the amorphous layer; and wherein the amorphous layer comprises $PbO-B_2O_3$, $Bi_2O_3-B_2O_3$, and/or $GeO_2-B_2O_3$.

3. The method of claim 1, wherein forming a dielectric material layer comprises:
depositing the dielectric material layer on the lower electrode; and
crystallizing the dielectric material layer.

4. The method of claim 1, wherein crystallizing the dielectric material layer comprises annealing the semiconductor substrate with the dielectric material layer thereon at a temperature of about 300 degrees centigrade to about 900 degrees centigrade in an oxidation ambient.

5. The method of claim 1, wherein forming the upper electrode is followed by:
annealing the capacitor at a temperature of about 300 degrees centigrade to about 900 degrees centigrade.

6. The method of claim 1, wherein forming an amorphous layer comprises forming the amorphous layer using organic metal oxide chemical vapor deposition, metal organic deposition, sputtering and/or spin coating.

7. A capacitor of a semiconductor device comprising:
a lower electrode on a semiconductor substrate;
a dielectric material layer comprising $Ba(Ti_{1-x}Sn_x)O_3$ (BTS) and/or $Ba(Ti_{1-x}Zr_x)O_3$ (BTZ) on the lower electrode;
an amorphous layer on the dielectric material layer; and
the upper electrode on the amorphous layer, wherein the amorphous layer comprises $PbO-B_2O_3$, $Bi_2O_3-B_2O_3$, and/or $GeO_2-B_2O_3$.

8. A method of forming a capacitor of a semiconductor device comprising:
forming a dielectric material layer comprising $Ba(Ti_{1-x}Sn_x)O_3$ (BTS) and/or $Ba(Ti_{1-x}Zr_x)O_3$ (BTZ);
forming an amorphous layer directly on the dielectric material layer;
forming an upper electrode of the capacitor on the amorphous layer; and
annealing at a temperature greater than a melting point of the amorphous layer.

9. A method according to claim 8 wherein annealing comprises annealing at a temperature of about 300 degrees centigrade to about 900 degrees centigrade.

10. A method according to claim 8 wherein annealing comprises annealing at a temperature of about 700 degrees centigrade.

11. A method according to claim 8 wherein forming the upper electrode and annealing are performed substantially simultaneously.

12. A method according to claim 8 wherein forming an amorphous layer comprises forming the amorphous layer comprising $PbO-B_2O_3$, $Bi_2O_3-B_2O_3$ and/or $GeO_2-B_2O_3$.

13. A method according to claim 12 wherein the $B_2O_3$ comprises about 2 mol% to about 20 mol%.

14. A method according to claim 8 wherein annealing at a temperature greater than a melting point of the amorphous layer forms a fused layer from the amorphous layer and the dielectric material layer.

15. A method according to claim 8 wherein forming an amorphous layer comprises forming the amorphous layer by sputtering using an amorphous target, thermal vaporing an amorphous powder, dipping an amorphous alkoxide solution, and/or spin coating an amorphous alkoxide solution.

16. A method of forming a capacitor of a semiconductor device comprising fusing a dielectric material layer comprising $Ba(Ti_{1-x}Sn_x)O_3$ (BTS) and/or $Ba(Ti_{1-x}Zr_x)O_3$ (BTZ) with an amorphous layer directly underlying the dielectric material layer at a temperature greater than a melting point of the amorphous layer.

17. A method according to claim 16 wherein fusing comprises annealing at a temperature of about 300 degrees centigrade to about 900 degrees centigrade.

* * * * *

UNITED STATES PATENT AND TRADEMARK OFFICE
CERTIFICATE OF CORRECTION

PATENT NO. : 7,179,704 B2 Page 1 of 1
APPLICATION NO. : 11/002571
DATED : February 20, 2007
INVENTOR(S) : Lee et al.

It is certified that error appears in the above-identified patent and that said Letters Patent is hereby corrected as shown below:

Column 6

Line 66: Please correct "amornhous" to read --amorphous--

Column 7

Line 1-2: Please correct "amornhous" to read --amorphous--

Signed and Sealed this

Eighth Day of May, 2007

JON W. DUDAS
*Director of the United States Patent and Trademark Office*